(12) United States Patent
Matsuda

(10) Patent No.: US 9,148,118 B2
(45) Date of Patent: Sep. 29, 2015

(54) ACOUSTIC WAVE FILTER AND MODULE

(71) Applicant: TAIYO YUDEN CO., LTD., Tokyo (JP)

(72) Inventor: Takashi Matsuda, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 131 days.

(21) Appl. No.: 14/041,985

(22) Filed: Sep. 30, 2013

(65) Prior Publication Data

US 2014/0118094 A1    May 1, 2014

(30) Foreign Application Priority Data

Nov. 1, 2012    (JP) ................................. 2012-241711

(51) Int. Cl.
    *H03H 9/64*    (2006.01)
    *H03H 9/10*    (2006.01)
    *H03H 1/00*    (2006.01)

(52) U.S. Cl.
    CPC ........... *H03H 9/1092* (2013.01); *H03H 9/1071* (2013.01); *H03H 9/6433* (2013.01); *H03H 9/6476* (2013.01); *H03H 2001/0085* (2013.01)

(58) Field of Classification Search
    CPC . H03H 9/1092; H03H 9/6433; H03H 9/1071; H03H 9/059; H03H 9/6476; H03H 2001/0085
    USPC .......................................... 333/193, 195, 133
    See application file for complete search history.

(56) References Cited

U.S. PATENT DOCUMENTS

| | | | |
|---|---|---|---|
| 7,518,470 B2 * | 4/2009 | Makibuchi et al. ........... 333/193 |
| 2005/0242903 A1 | 11/2005 | Inoue et al. | |
| 2008/0284540 A1 * | 11/2008 | Nishihara et al. ............. 333/133 |
| 2011/0221546 A1 * | 9/2011 | Yamaji et al. .................. 333/193 |
| 2012/0241211 A1 | 9/2012 | Inoue et al. | |
| 2012/0280768 A1 * | 11/2012 | Nakayama et al. ........... 333/193 |
| 2013/0062995 A1 | 3/2013 | Matsuda et al. | |
| 2014/0003017 A1 * | 1/2014 | Kai et al. ....................... 361/783 |
| 2014/0176257 A1 * | 6/2014 | Takamine ..................... 333/133 |

FOREIGN PATENT DOCUMENTS

| | | | |
|---|---|---|---|
| JP | 9-326447 A | | 12/1997 |
| JP | 2005-318307 A | | 11/2005 |
| JP | 2009-218762 | * | 9/2009 |
| JP | 2010-157956 A | | 7/2010 |
| JP | 2010-233267 A | | 10/2010 |
| JP | 2012-199833 A | | 10/2012 |
| JP | 2013-058911 A | | 3/2013 |
| WO | WO 2012/132147 | * | 10/2012 |
| WO | WO 2012/169231 | * | 12/2012 |

* cited by examiner

*Primary Examiner* — Barbara Summons
(74) *Attorney, Agent, or Firm* — Chen Yoshimura LLP

(57) ABSTRACT

An acoustic wave filter includes: multimode filters, each including an IDT, connected in parallel; a ceiling that is commonly located above at least two multimode filters of the multimode filters so as to form a cavity between the IDT and the ceiling, electrically connected to the multimode filters, and formed of a metal; and at least two terminals that are electrically connected to the ceiling and located above the at least two multimode filters.

6 Claims, 9 Drawing Sheets

$L_1=0.2nH, L_2=0.2nH$ ———
$L_1=0.1nH, L_2=0nH$ - - - - -

$L_1=0.05nH, L_2=0.3nH$ ———
$L_1=0nH, L_2=0.042857nH$ - - - - -

ACOUSTIC WAVE FILTER AND MODULE

CROSS-REFERENCE TO RELATED APPLICATION

This application is based upon and claims the benefit of priority of the prior Japanese Patent Application No. 2012-241711, filed on Nov. 1, 2012, the entire contents of which are incorporated herein by reference.

FIELD

A certain aspect of the present invention relates to an acoustic wave filter and a module.

BACKGROUND

Acoustic wave filters such as Surface Acoustic Wave (SAW) devices have been used as filters and duplexers installed in communication devices such as mobile phones. The acoustic wave filter is required to have a high degree of suppression in the suppression band and low-loss in the passband. Japanese Patent Application Publication No. 2010-233267 discloses an acoustic wave filter having a Double Mode SAW filter (DMS) and a one-port resonator interconnected. Japanese Patent Application Publication No. 2005-318307 discloses a technique that mounts a chip including a SAW filter on a package. Japanese Patent Application Publication No. 9-326447 discloses a technique that seals an IDT (Interdigital Transducer: comb-shaped electrode) included in a SAW filter by a resin. Japanese Patent Application Publication No. 2010-157956 discloses a technique that provides a top plate made of a metal above an IDT.

The acoustic wave filter has been required to be downsized. When ceilings above IDTs are integrated, the acoustic wave filter can be downsized. However, there may be a case that ceilings are provided above respective IDTs to prevent short between the ceilings. For example, the ceiling may be grounded through an inductor to improve frequency characteristics of the acoustic wave filter. The ceilings are required to have different electric potentials at this time, and in this case, the acoustic wave filter is difficult to be downsized.

SUMMARY OF THE INVENTION

According to an aspect of the present invention, there is provided an acoustic wave filter including: multimode filters, each including an IDT, connected in parallel; a ceiling that is commonly located above at least two multimode filters of the multimode filters so as to form a cavity between the IDT and the ceiling, electrically connected to the multimode filters, and formed of a metal; and at least two terminals that are electrically connected to the ceiling and located above the at least two multimode filters.

DETAILED DESCRIPTION

Figure 1:
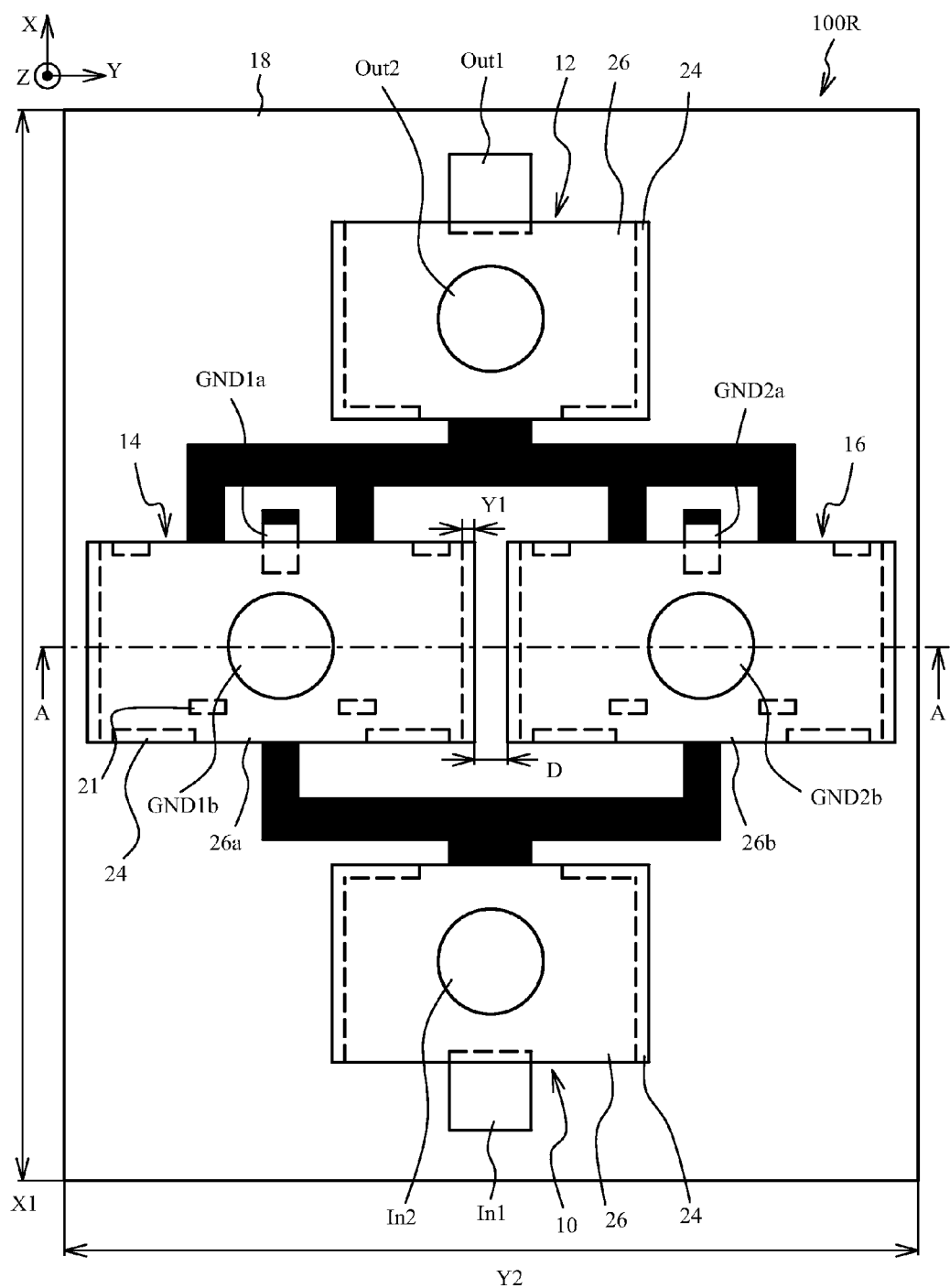
FIG. 1 is a plan view illustrating an acoustic wave filter in accordance with a comparative example.
Figure 2:
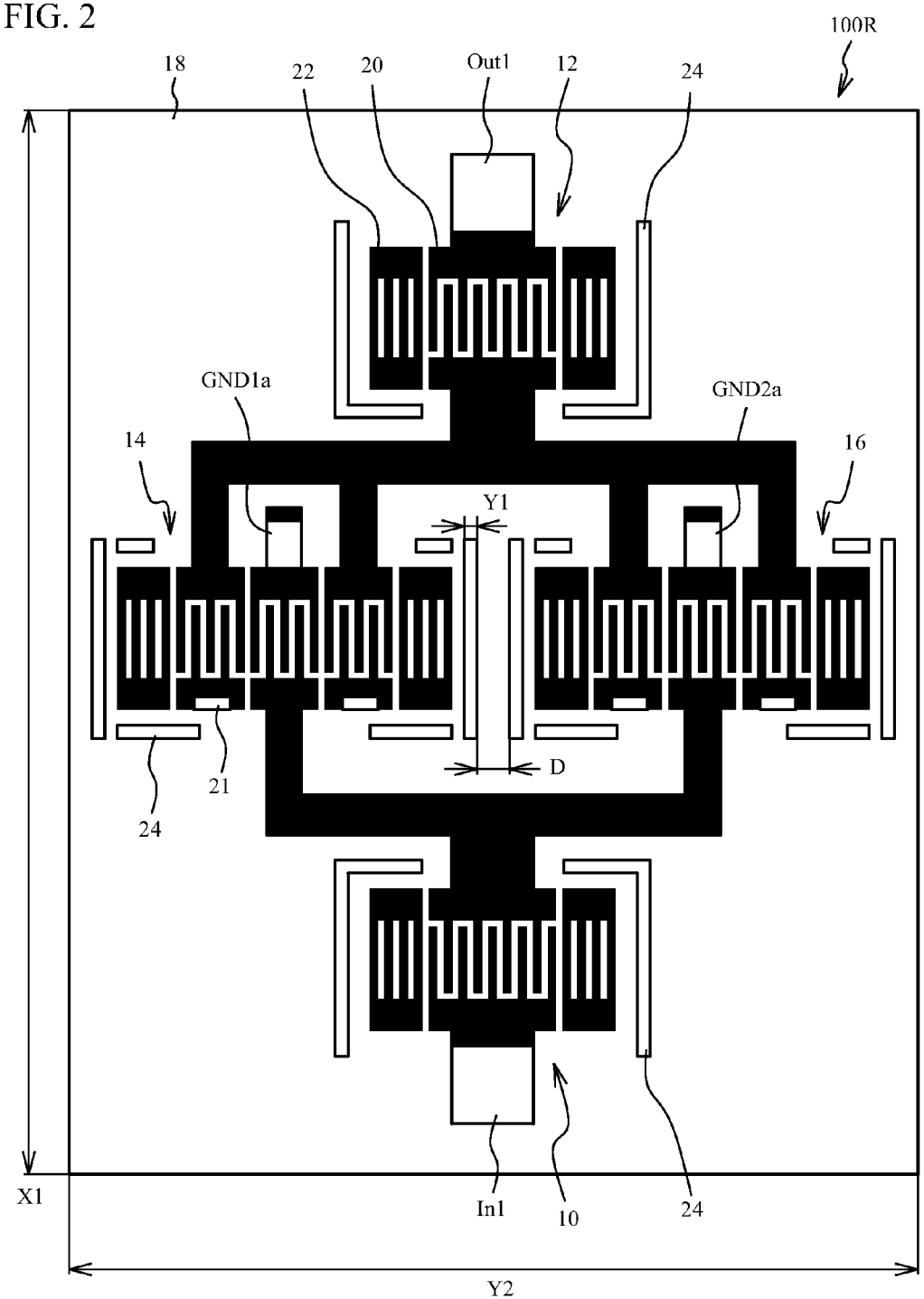
FIG. 2 is a plan view illustrating a structure of the acoustic wave filter with ceilings removed.
Figure 3A:
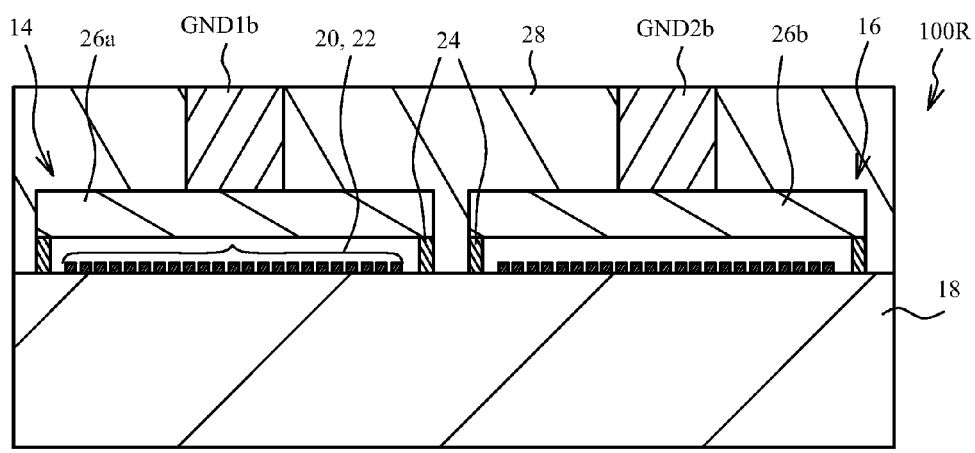
FIG. 3A is a cross-sectional view illustrating the acoustic wave filter.

A description will first be given of a comparative example. FIG. 1 is a plan view illustrating an acoustic wave filter 100R in accordance with the comparative example. In FIG. 1, dashed lines represent supporting posts 24 and pads below ceilings 26. FIG. 2 is a plan view illustrating a structure of the acoustic wave filter 100R with the ceilings 26 removed. FIG. 3A is a cross-sectional view of the acoustic wave filter 100R taken along line A-A in FIG. 1. The X direction is a direction in which electrode fingers of an IDT 20 extend. The Y direction is the array direction of the electrode fingers. The Z direction is the thickness direction of a piezoelectric substrate 18. These directions correspond to respective directions in FIG. 4 and FIG. 9.

As illustrated in FIG. 1 to FIG. 3A, the acoustic wave filter 100R includes one-port type resonators 10 and 12 and DMSs 14 and 16. The resonators 10 and 12 and the DMSs 14 and 16 include the piezoelectric substrate 18, and the IDTs 20 and reflectors 22 located on the piezoelectric substrate 18. An input pad In1 is electrically coupled to a first electrode of the IDT 20 of the resonator 10. An output pad Out1 is electrically coupled to a first electrode of the IDT 20 of the resonator 12. The DMSs 14 and 16 are connected in parallel between the resonator 10 and the resonator 12. A ground pad GND1$a$ is coupled to one of the IDTs 20 included in the DMS 14. A ground pad GND2$a$ is coupled to one of the IDTs 20 included in the DMS 16. Two of the IDTs 20 of the DMS 14 are coupled to a ceiling 26$a$ through supporting posts 21 while two of the IDTs 20 of the DMS 16 are coupled to a ceilings 26$b$ through the supporting posts 21. When voltage is applied to the IDT 20, the IDT 20 excites an acoustic wave. The reflectors 22 are located at both sides of the IDT 20 along the propagation direction of the acoustic wave, and reflect the acoustic wave toward the IDT 20. The acoustic wave filter 100R is a SAW filter.

The supporting posts 24 are located on the piezoelectric substrate 18 to surround the resonators 10 and 12 and the DMSs 14 and 16. Two supporting posts 24 are located between the DMS 14 and the DMS 16. The corresponding ceiling 26 is located above each of the resonators 10 and 12 and the DMSs 14 and 16. The supporting posts 24 support the ceilings 26. Since a cavity is formed between the IDT 20 and the ceiling 26 and between the reflectors 22 and the ceiling 26, the acoustic wave is not prevented from exciting. The ceiling above the DMS 14 is described as the ceiling 26$a$, and the ceiling above the DMS 16 is described as the ceiling 26$b$ in the ceilings 26. The ceiling 26 above the resonator 10 is coupled to the input pad In1 and an input terminal In2. The ceiling 26 above the resonator 12 is coupled to the output pad Out1 and an output terminal Out2. The ceiling 26$a$ is coupled to the ground pad GND1$a$ and a ground terminal GND1$b$. The ceiling 26$b$ is coupled to the ground pad GND2$a$ and a ground terminal GND2$b$. The input terminal In2 and the output terminal Out2 are located on the ceiling 26, the ground terminal GND1$b$ is located on the ceiling 26$a$, and the ground terminal GND2*b* is located on the ceiling 26*b*. Sealing portions 28 are located on the ceilings 26 so that the terminals are exposed.

The piezoelectric substrate 18 is formed of a piezoelectric substance such as lithium tantalate (LiTaO$_3$) or lithium niobate (LiNbO$_3$). The IDTs 20 and the reflectors 22 are formed of a metal such as aluminum (Al). The ceilings 26 and the supporting posts 24 are formed of a metal such as copper (Cu). The supporting post 24 has a width Y1 of, for example, 20 μm. The sealing portion 28 is formed of an insulating material such as an epoxy resin.

A Radio Frequency (RF) signal is input to the input terminal In2. The RF signal is input to the resonator 10 through the input pad In1. A signal with a frequency in the passband of the acoustic wave filter 100R, out of RF signals, is transmitted through the acoustic wave filter 100R, and output from the output terminal Out2 to the output pad Out1.

Figure 3B:
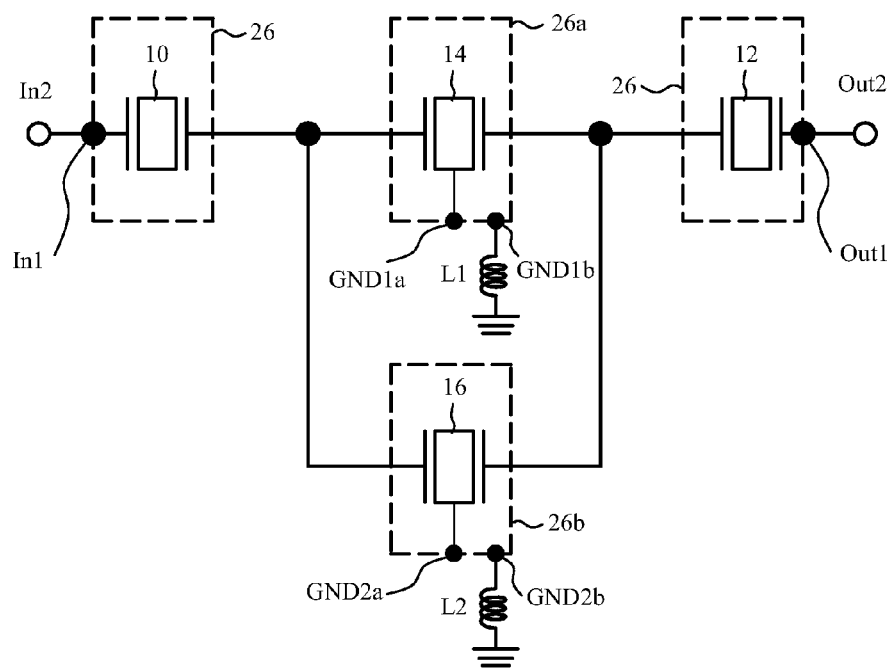
FIG. 3B is a circuit diagram of the acoustic wave filter.

FIG. 3B is a circuit diagram of the acoustic wave filter 100R. In FIG. 3B, dashed lines represent the ceilings 26, 26*a*, and 26*b*. Black circles intersecting with the ceiling 26*a* represent the ground pad GND1*a* and the ground terminal GND1*b*. Black circles intersecting with the ceiling 26*b* represent the ground pad GND2*a* and the ground terminal GND2*b*.

The ceiling 26*a* is coupled to an inductor L1 through the ground terminal GND1*b*. The DMS 14 is grounded through the ceiling 26*a* and the inductor L1. The ceiling 26*b* is coupled to an inductor L2 through the ground terminal GND2*b*. The DMS 16 is grounded through the ceiling 26*b* and the inductor L2. Assume that the inductor L1 has an inductance L$_1$, and the inductor L2 has an inductance L$_2$. The adjustment of the inductances L$_1$ and L$_2$ enables to improve the frequency of the acoustic wave filter 100R.

Different inductors are coupled to the ceiling 26*a* and the ceiling 26*b*, and thus cause the electric potential of the ceiling 26*a* to differ from that of the ceiling 26*b*. Thus, the ceiling 26*a* is made to be insulated from the ceiling 26*b*. Therefore, a distance D needs to be secured between the ceiling 26*a* and the ceiling 26*b*. Therefore, downsizing of the acoustic wave filter 100R becomes difficult. The distance D is, for example, 25 μm, and the acoustic wave filter 100R have a width Y2 of, for example, 700 μm. The acoustic wave filter 100R has a size of X1×Y2=1000 μm×700 μm. A description will next be given of a first embodiment.

First Embodiment

Figure 4:
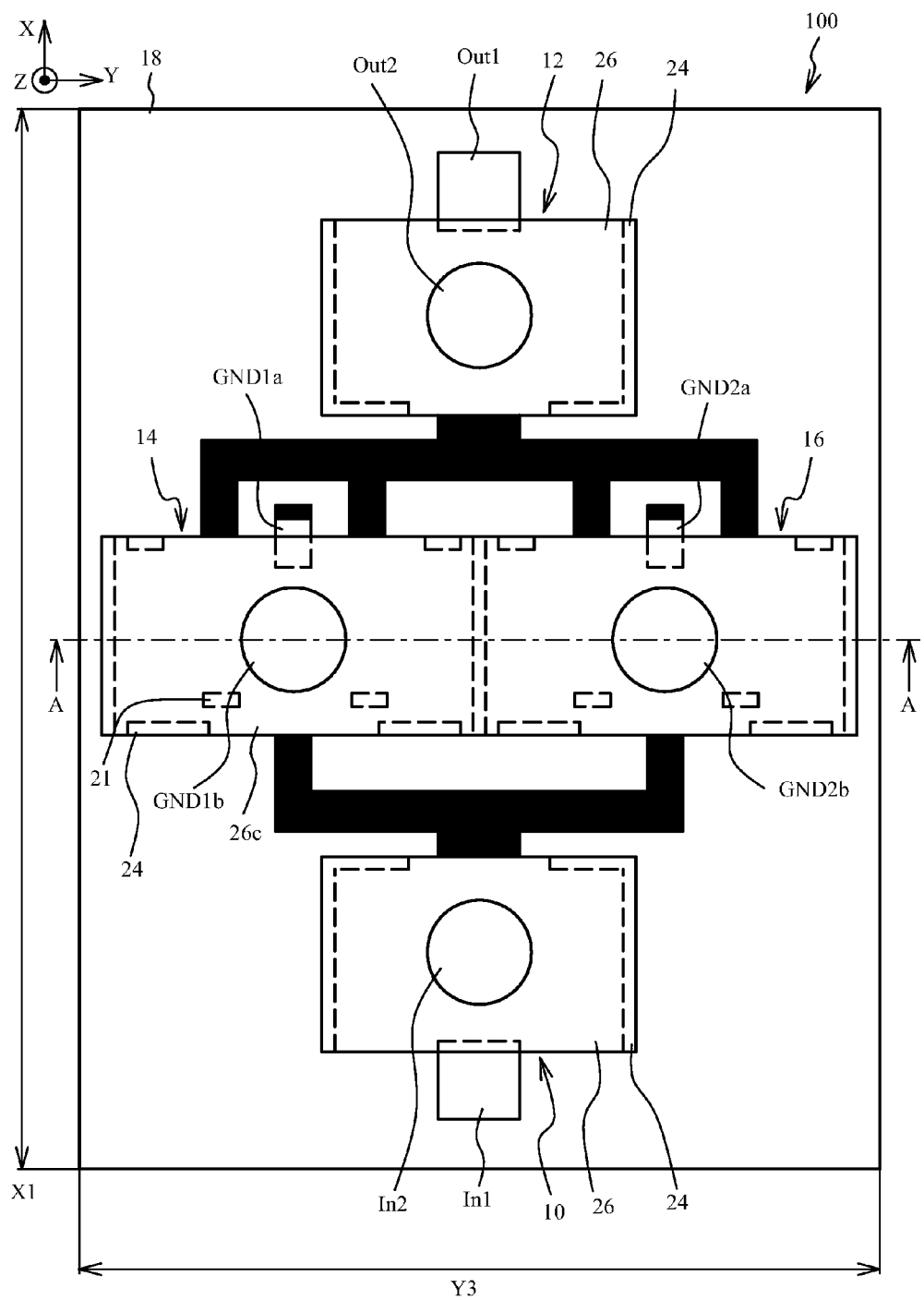
FIG. 4 is a plan view illustrating an acoustic wave filter in accordance with a first embodiment.
Figure 5:
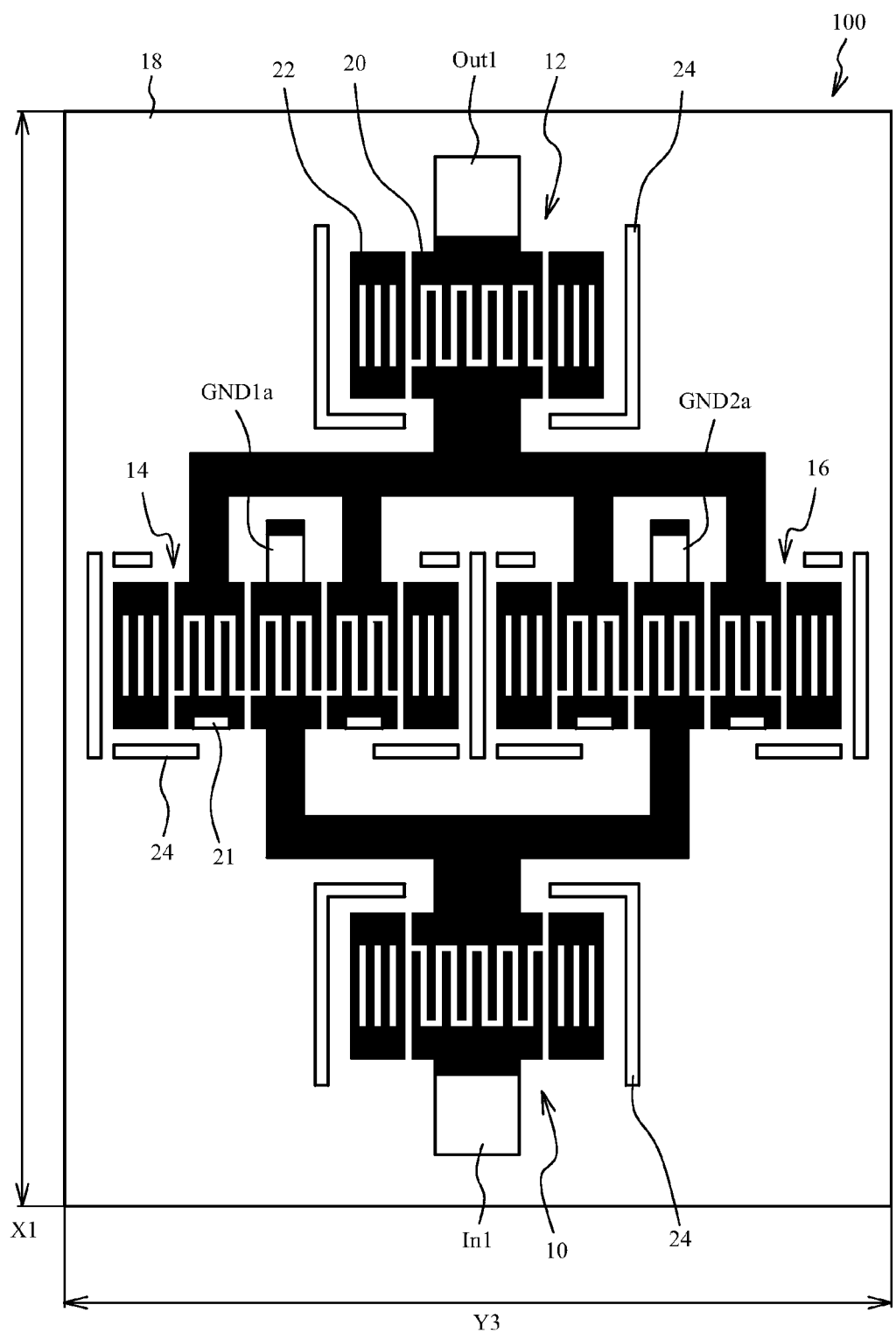
FIG. 5 is a plan view illustrating a structure of the acoustic wave filter with ceilings removed.
Figure 6A:
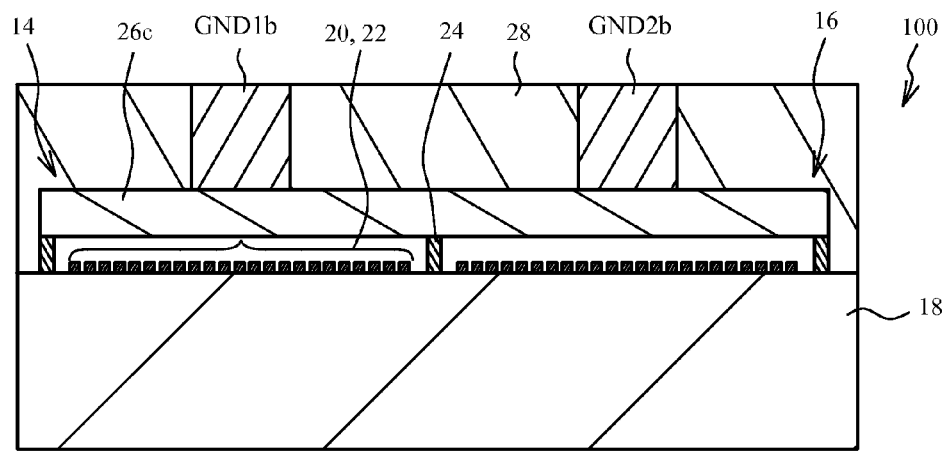
FIG. 6A is a cross-sectional view illustrating the acoustic wave filter.

A first embodiment integrates the ceiling 26*a* and the ceiling 26*b*. FIG. 4 is a plan view illustrating an acoustic wave filter 100 in accordance with the first embodiment. FIG. 5 is a plan view illustrating a structure of the acoustic wave filter 100 with ceilings removed. FIG. 6A is a cross sectional view of the acoustic wave filter 100 taken along line A-A in FIG. 4.

As illustrated in FIG. 4 to FIG. 6A, a single ceiling 26*c* is located above the DMSs 14 and 16. The supporting posts 24 that support the ceiling 26*c* are located so as to surround the IDTs 20 and the reflectors 22 of the DMSs 14 and 16. The ceiling 26*c* is coupled to the IDT 20 of the DMS 14 through the ground pad GND1*a* and the supporting post 21, and coupled to the IDT 20 of the DMS 16 through the ground pad GND2*a* and the supporting post 21. The ground terminal GND1*b* is coupled to the ceiling 26*c* at a position overlapping the DMS 14 while the ground terminal GND2*b* is coupled to the ceiling 26*c* at a position overlapping the DMS 16.

The first embodiment integrates the ceiling above the DMSs 14 and 16. Thus, it is not necessary to secure the distance D in FIG. 1 and FIG. 2. Also, only a single supporting post 24 is necessary between the DMS 14 and the DMS 16. Therefore, the space between the DMS 14 and the DMS 16 can be reduced. The acoustic wave filter 100 has a width Y3 of 655 μm, and is less than the width Y2 of the comparative example by 45 μm that is the sum of the distance D (=25 μm) and the width Y1 of the supporting post 24 (=20 μm).

Figure 6B:
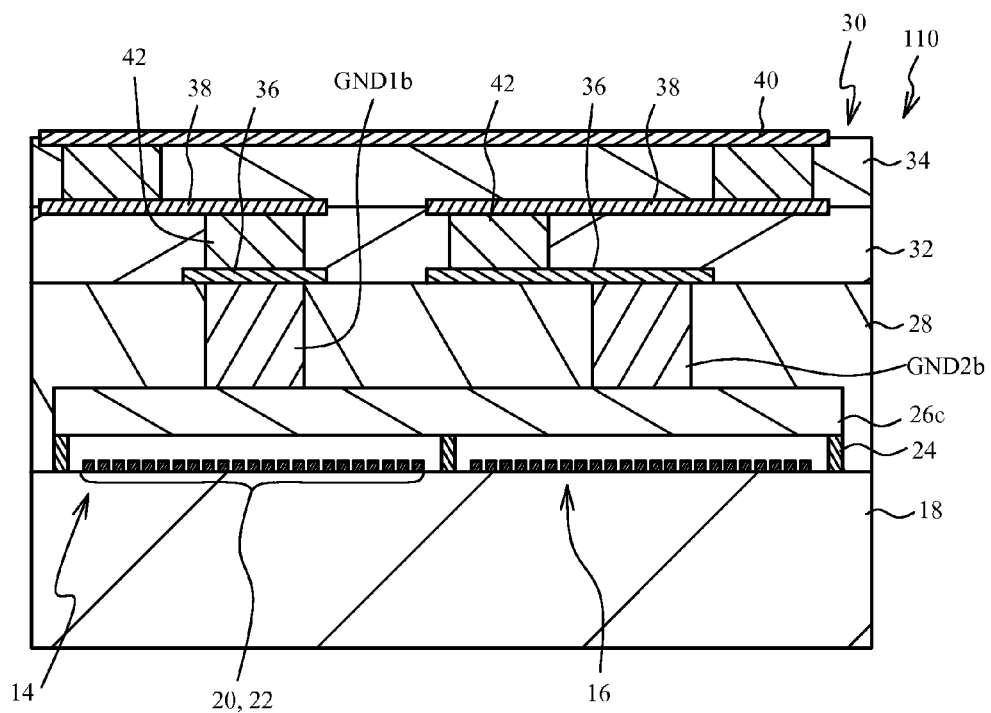
FIG. 6B is a cross-sectional view illustrating a module.

A description will now be given of a module 110 including the acoustic wave filter 100. FIG. 6B is a cross-sectional view illustrating the module 110.

As illustrated in FIG. 6B, a substrate 30 of the module 110 is a multilayered substrate formed by stacking insulating layers 32 and 34 in this order from the bottom side. A metal layer 36 is formed on the lower surface of the insulating layer 32, a metal layer 38 is formed between the insulating layer 32 and the insulating layer 34, and a metal layer 40 is formed on the upper surface of the insulating layer 34. The metal layers are electrically interconnected by via wirings 42 piercing through the insulating layer. The ground terminals GND1*b* and GND2*b* are coupled to the metal layer 40 through the metal layers 36 and 38 and the via wirings 42. The insulating layers 32 and 34 are formed of an insulating material such as a glass epoxy or ceramic. The metal layers 36, 38 and 40 and the via wirings 42 are formed of a metal such as Cu.

Figure 7:
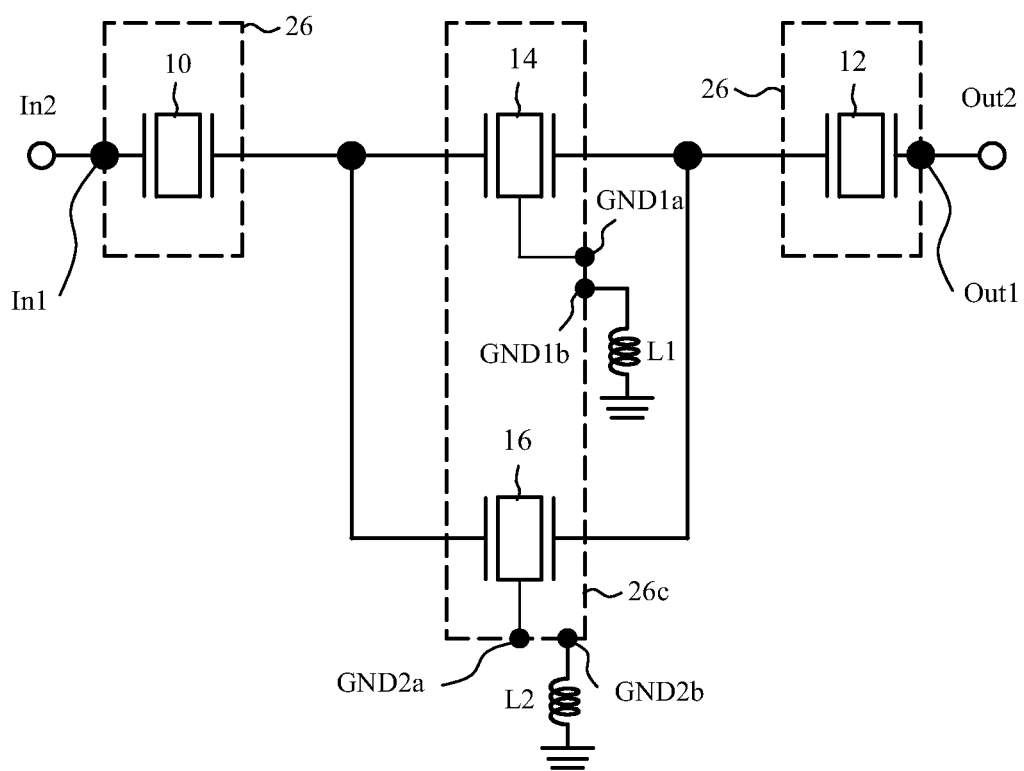
FIG. 7 is a circuit diagram of the module.

FIG. 7 is a circuit diagram of the module 110. As illustrated in FIG. 7, the ceiling 26*c* is coupled to the inductor L1 through the ground terminal GND1*b*, and is coupled to the inductor L2 through the ground terminal GND2*b*. The inductor L1 is formed by the metal layers 36 and 38 and the via wirings 42 that connect the ground terminal GND1*b* to the metal layer 40. The inductor L2 is formed by the metal layers 36 and 38 and the via wirings 42 that connect the ground terminal GND2*b* to the metal layer 40. That is to say, the substrate 30 includes the inductors L1 and L2.

The inductor L1 and the inductor L2 are electrically interconnected through the ceiling 26*c*. The ceiling 26*c* has, however, an inductance component. Thus, the inductor L1 and the inductor L2 do not have the same electric potential with respect to the RF signal. That is to say, as with the acoustic wave filter 100R having the inductors connected to the separate ceilings 26*a* and 26*b*, the inductance L$_1$ affects resonance characteristics of the DMS 14 while the inductance L$_2$ affects resonance characteristics of the DMS 16. The inductance L$_1$ and L$_2$ change frequency characteristics of the acoustic wave filter 100.

A description will next be given of the frequency characteristics. Frequency characteristics were simulated by changing the inductances L$_1$ and L$_2$. Parameters used in the simulation are as follows.

Thicknesses of the ceilings 26 and 26*c*: 20 μm,
Height of the supporting post 24: 5 μm
Width of the supporting post 24: 20 μm
Passband of the acoustic wave filter 100: 1710 to 1755 MHz (transmit band of W-CDMA Band 4)

Figure 8A:
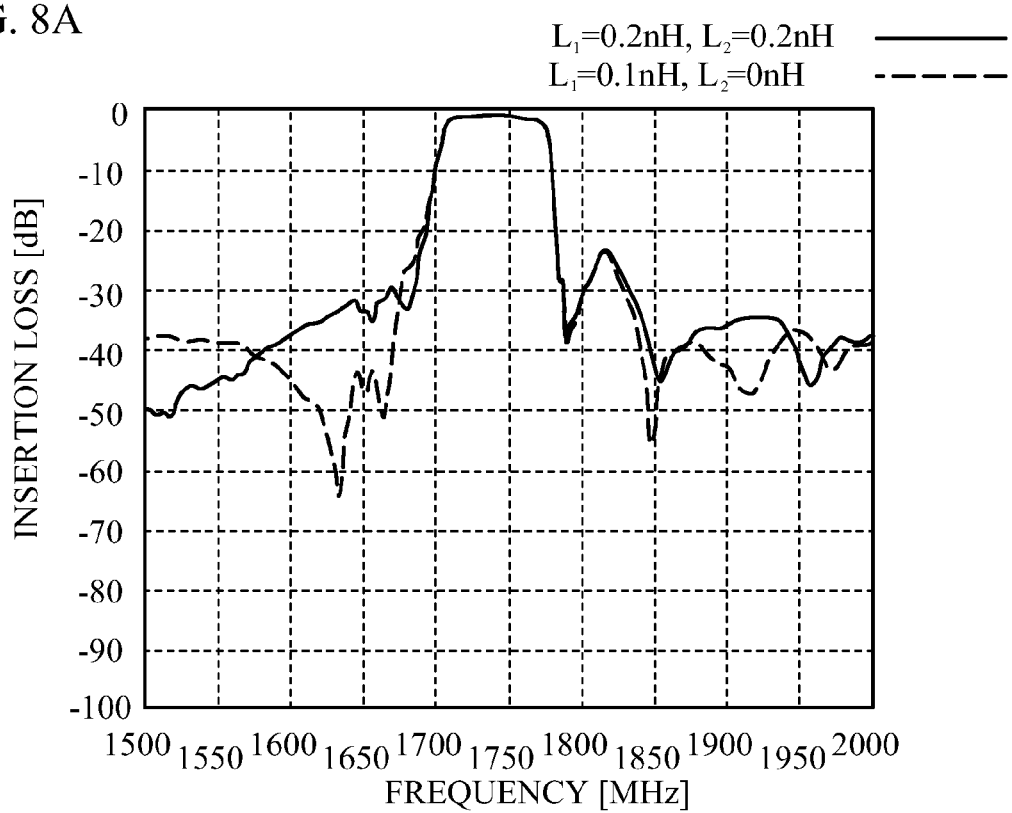
FIG. 8A and FIG. 8B are graphs illustrating simulation results of frequency characteristics.
Figure 8B:
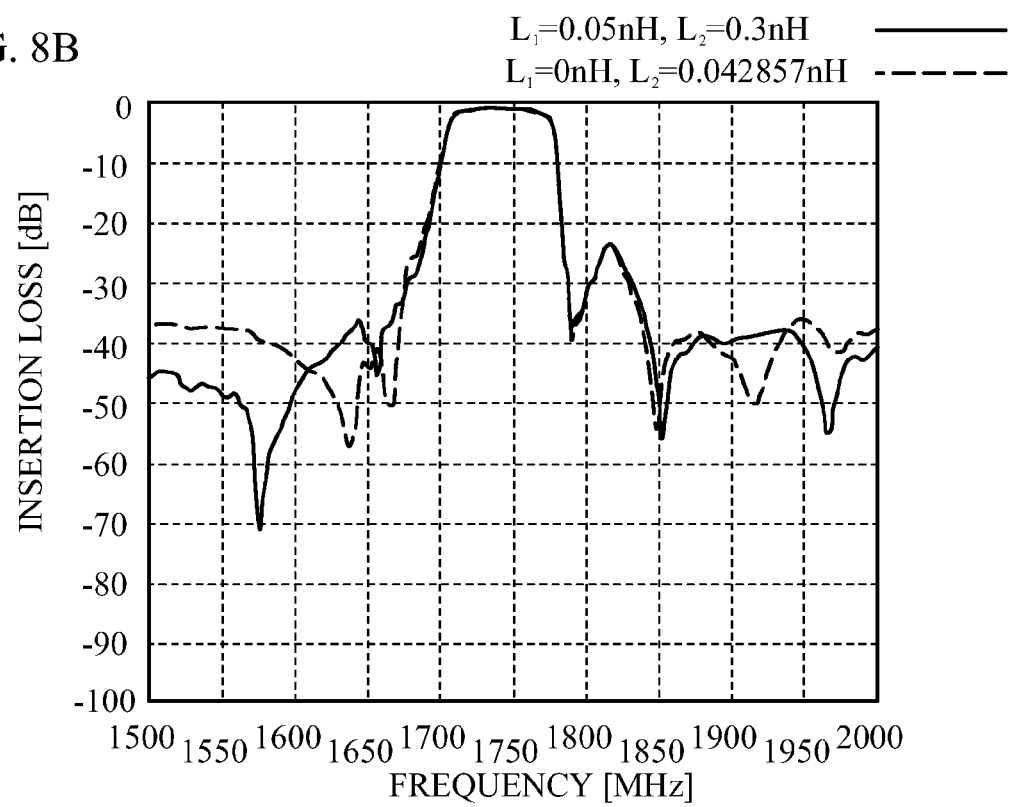

FIG. 8A and FIG. 8B are graphs illustrating simulation results of the frequency characteristics. The horizontal axis represents frequency and the vertical axis represents insertion loss.

In FIG. 8A, the dashed line indicates a case of L$_1$=0.1 nH, L$_2$=0 nH. That is to say, the inductor L1 is coupled to the ceiling 26*c*, but the inductor L2 is not coupled. The solid line indicates a case of L$_1$=0.2 nH, L$_2$=0.2 nH. In both cases, the combined inductance of L1 and L2 is 0.1 nH. However, as illustrated in FIG. 8A, the frequency characteristics differ from each other. That is to say, even when the combined inductance is the same, the frequency characteristics are changed by connecting the inductors to the different positions in the ceiling 26*c*. This demonstrates that the inductors L1 and L2 do not have the same potential with respect to the RF signal.

In FIG. 8B, the dashed line indicates a case of $L_1=0$ nH, $L_2=0.042857$ nH. The solid line indicates a case of $L_1=0.05$ nH, $L_2=0.3$ nH. In both cases, the combined inductance is 0.042857 nH. The frequency characteristics are improved in the case indicated by the solid line compared to that of the case indicated by the dashed line. Especially, the degree of suppression at a low frequency side increases. Around 1570 MHz, an attenuation pole is formed. As described above, the adjustment of the inductances $L_1$ and $L_2$ improves the frequency characteristics.

The first embodiment can reduce the size and improve the frequency characteristics. The adjustment of the inductances $L_1$ and $L_2$ enables to obtain desired frequency characteristics. For example, an attenuation pole can be formed around 1570 MHz that is used for GPS (Global Positioning System) as illustrated in FIG. 8B. The adjustment of the inductances $L_1$ and $L_2$ enables to form an attenuation pole at another frequency and increase the degree of suppression at a low frequency side.

Figure 9:
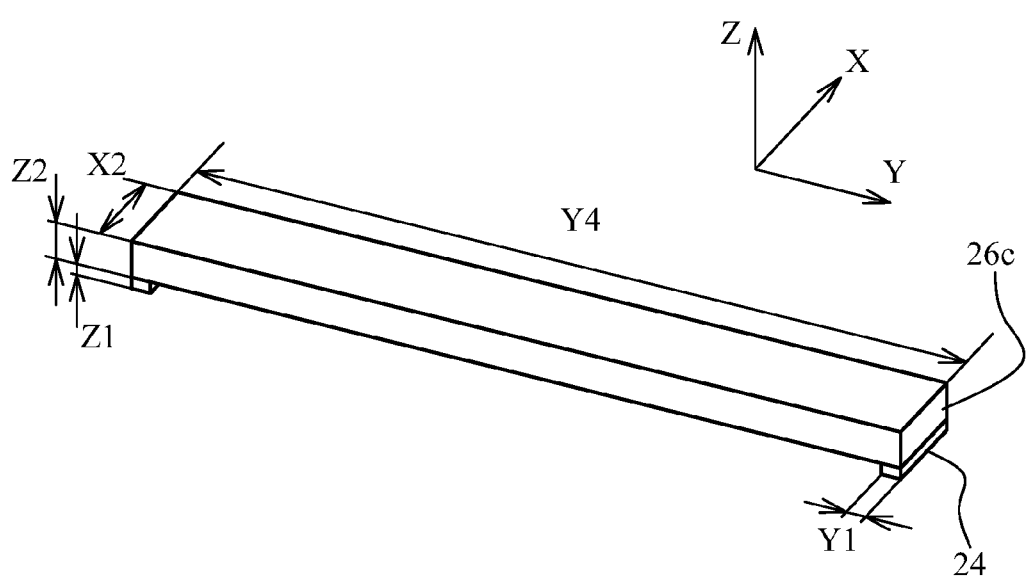
FIG. 9 is a perspective view illustrating supporting posts and a ceiling.

FIG. 9 is a perspective view illustrating the supporting posts 24 and the ceiling 26c. The X, Y, Z directions in FIG. 9 correspond to the respective directions in FIG. 1 and FIG. 4. X2 represents the lengths of the supporting post 24 and the ceiling 26c in the X direction. Y4 is the width of the ceiling 26c in the Y direction. Z1 is the height of the supporting post 24. Z2 is the thickness of the ceiling 26c. The dimensions of the supporting post 24 and the ceiling 26c were changed, and the inductance was calculated. Assume that the supporting post 24 and the ceiling 26c are formed of Cu. The inductance of the supporting post 24 is the inductance in the Z direction. The inductance of the ceiling 26c is the inductance in the Y direction.

Table 1 is a table presenting the dimension of the supporting post 24 and calculation results of the inductance. Table 2 is a table presenting the dimension of the ceiling 26c and calculation results of the inductance.

TABLE 1

| X2 [μm] | Y1 [μm] | Z1 [μm] | INDUCTANCE [nH] |
|---|---|---|---|
| 50 | 10 | 5 | 0.00023 |
| 50 | 10 | 10 | 0.00080 |
| 50 | 10 | 15 | 0.00162 |

TABLE 2

| X2 [μm] | Y4 [μm] | Z2 [μm] | INDUCTANCE [nH] |
|---|---|---|---|
| 50 | 100 | 10 | 0.03402 |
|  | 200 |  | 0.09174 |
|  | 300 |  | 0.15984 |
|  | 400 |  | 0.23465 |
|  | 100 | 20 | 0.03087 |
|  | 200 |  | 0.08486 |
|  | 300 |  | 0.14921 |
|  | 400 |  | 0.22035 |
| 100 | 100 | 10 | 0.02563 |
|  | 200 |  | 0.07243 |
|  | 300 |  | 0.12924 |
|  | 400 |  | 0.19266 |
|  | 100 | 20 | 0.02369 |
|  | 200 |  | 0.06805 |
|  | 300 |  | 0.12252 |
|  | 400 |  | 0.18349 |

As presented in Table 1, the inductance of the supporting post 24 is less than or equal to 0.00162 nH, and very small. Thus, the inductance of the supporting post 24 hardly affects the frequency characteristics. As presented in Table 2, the ceiling 26c sometimes has a large inductance such as greater than or equal to 0.1 nH. Thus, the frequency characteristics can be improved by connecting two or more inductors as described in the first embodiment.

The length X2 can be changed in accordance with the aperture length of the electrode finger. The width Y4 can be changed in accordance with the width, the pitch, or the number of the electrode fingers. It is sufficient if the height Z1 have a height enough to secure the space in which the IDT 20 vibrates. It is sufficient if the thickness Z2 has a height with which the ceiling 26c does not crush.

The first embodiment arranges two DMSs connected in parallel. However, it is sufficient if two or more DMSs are connected in parallel, and the number of DMSs may be three or more. The single ceiling 26c is located above at least two DMSs and electrically coupled to them. The ground terminals are located above at least two DMSs, and coupled to inductors. Two or more inductors may have the same inductance, or different inductances. The frequency characteristics can be optimized by adjusting the inductances to have different values.

The resonators 10 and 12 increase the degree of suppression around the passband. It is sufficient if the resonator is located at least one of between the DMSs 14 and 16 and the input terminal In2, between the DMSs 14 and 16 and the output terminal Out2. The frequency characteristics of the resonators 10 and 12 can be changed in accordance with the frequency characteristics of the acoustic wave filter 100. The first embodiment describes a case where input and output are of an unbalanced type. At least one of the input and the output may be of a balanced type. For example, at least one of an input terminal and an output terminal is of a balanced type, and terminals of the balanced type may be coupled to input sides or output sides of the DMS 14 and 16 through respective resonators.

The present embodiment may use a multimode filter other than a DMS. The acoustic wave filter 100 may be an acoustic wave filter such as a boundary acoustic wave filter or a Love wave filter that provide a ceiling above the IDT instead of the SAW filter. As illustrated in FIG. 6B, the inductors L1 and L2 may be formed as a wiring of the substrate 30. In addition, two wires may be extracted from the ceiling 26c. The inductance components of the wires become $L_1$ and $L_2$. A chip inductor may be coupled to the ceiling 26c.

Although the embodiments of the present invention have been described in detail, it is to be understood that the various change, substitutions, and alterations could be made hereto without departing from the spirit and scope of the invention.

What is claimed is:

1. An acoustic wave filter comprising:
   multimode filters, each including an IDT, connected in parallel;
   a ceiling that is commonly located above at least two multimode filters of the multimode filters so as to form a cavity between the IDT and the ceiling, electrically connected to the multimode filters, and formed of a metal; and
   at least two terminals, each electrically connected to the ceiling for connecting the ceiling to an external ground, said at least two terminals being located directly above the at least two multimode filters, respectively, so that each of said at least two terminals is directly above a corresponding one of said at least two multimode filters.

2. The acoustic wave filter according to claim 1, wherein each of the at least two terminals is configured to be connected to the external ground through an inductor.

3. The acoustic wave filter according to claim 1, further comprising:
   a resonator connected at least one of between the multimode filters and an input terminal and between the multimode filters and an output terminal.

4. The acoustic wave filter according to claim 1, further comprising:
   a sealing portion that is located above the ceiling so that the at least two terminals are exposed.

5. A module comprising:
   at least two inductors; and
   a substrate on which the acoustic wave filter according to claim 1 is mounted,
   wherein said at least two terminals are connected to the external ground through said at least two inductors, respectively.

6. An acoustic wave filter comprising:
   multimode filters, each including an IDT, connected in parallel;
   a ceiling that is commonly located above at least two multimode filters of the multimode filters so as to form a cavity between the IDT and the ceiling, electrically connected to the multimode filters, and formed of a metal; and
   at least two terminals that are electrically connected to the ceiling and located above the at least two multimode filters,
   wherein each of the at least two terminals is configured to be connected to an external ground through an inductor,
   wherein an inductance of the inductor through which one of the at least two terminals is connected to the external ground has a value different from an inductance of the inductor through which another of the at least two terminals is connected to the external ground.

* * * * *